(12) United States Patent
Uchida et al.

(10) Patent No.: US 7,618,833 B2
(45) Date of Patent: Nov. 17, 2009

(54) METHOD FOR PRE-TREATING EPITAXIAL LAYER, METHOD FOR EVALUATING EPITAXIAL LAYER, AND APPARATUS FOR EVALUATING EPITAXIAL LAYER

(75) Inventors: Shinjirou Uchida, Tokyo (JP); Sumio Miyazaki, Tokyo (JP)

(73) Assignee: Sumco Corporation, Tokyo (JP)

( * ) Notice: Subject to any disclaimer, the term of this patent is extended or adjusted under 35 U.S.C. 154(b) by 253 days.

(21) Appl. No.: 11/595,321

(22) Filed: Nov. 10, 2006

(65) Prior Publication Data

US 2007/0105344 A1 May 10, 2007

(30) Foreign Application Priority Data

Nov. 10, 2005 (JP) ............................. P2005-325789
Nov. 7, 2006 (JP) ............................. P2006-301500

(51) Int. Cl.
*H01L 21/66* (2006.01)
*G01R 31/26* (2006.01)

(52) U.S. Cl. ............................. 438/17; 438/14; 438/18; 438/787; 438/788; 257/E21.521

(58) Field of Classification Search .................... 438/14, 438/17, 18; 257/E21.521
See application file for complete search history.

(56) References Cited

U.S. PATENT DOCUMENTS

| 4,973,563 | A | * | 11/1990 | Prigge et al. | ................. 438/692 |
| 5,264,396 | A | * | 11/1993 | Thakur et al. | ................. 438/695 |
| 5,578,504 | A | * | 11/1996 | Mitani et al. | ................. 438/17 |
| 6,168,961 | B1 | * | 1/2001 | Vaccari | .................... 438/16 |
| 6,492,827 | B1 | * | 12/2002 | Mazur et al. | ................. 324/761 |
| 6,511,921 | B1 | * | 1/2003 | Panczyk et al. | .............. 438/770 |
| 6,842,029 | B2 | * | 1/2005 | Howland | ..................... 324/765 |

FOREIGN PATENT DOCUMENTS

| JP | H6-140478 | 5/1994 |
| JP | 2002-516486 | 6/2002 |
| JP | 2002-516486 | 6/2004 |
| WO | WO 99/60615 | 11/1999 |

* cited by examiner

*Primary Examiner*—Charles D Garber
*Assistant Examiner*—Angel Roman
(74) *Attorney, Agent, or Firm*—Kolisch Hartwell, P.C.

(57) ABSTRACT

A method for pre-treating an epitaxial layer performed before evaluation of the epitaxial layer by making the epitaxial layer contact with a metal electrode by a capacitance-voltage measurement, the method comprising; applying carbon-bearing compound to a surface of the epitaxial layer; subsequently irradiating ultraviolet light to the surface of the epitaxial layer; and thereby forming an oxide film on the surface of the epitaxial layer.

10 Claims, 12 Drawing Sheets

METHOD FOR PRE-TREATING EPITAXIAL LAYER, METHOD FOR EVALUATING EPITAXIAL LAYER, AND APPARATUS FOR EVALUATING EPITAXIAL LAYER

BACKGROUND OF THE INVENTION

1. Field of the Invention

The present invention relates to a method for pre-treating an epitaxial layer, a method for evaluating an epitaxial layer, and an apparatus for evaluating an epitaxial layer. Specifically, the present invention relates to a method for pre-treating an epitaxial layer a method for evaluating an epitaxial layer, and an apparatus for evaluating an epitaxial layer, which enable stable measurement of resistivity of the epitaxial layer. Priority is claimed on Japanese Patent Application No. 2005-325789 filed Nov. 10, 2005, and Japanese Patent Application No. 2006-301500 filed Nov. 7, 2006, the content of which is incorporated herein with reference.

2. Description of Related Art

Recent remarkable progress of the integrity of silicon semiconductor devices requires a strictly high quality of silicon wafer as a substrate for the semiconductor device.

For example, since crystalline defects such as dislocations and metallic impurities cause an increase of leak current and reduction of carrier-lifetime, reduction or elimination of the crystalline defects and metallic impurities from a device active region as a region for forming devices on a wafer is strictly demanded compared with the conventional level, in order to satisfy refinements of circuits with increasing integrity.

In order to satisfy such demands, an epitaxial wafer has been developed by growing an epitaxial layer substantially free of crystalline defects on the wafer, and frequently used in the manufacture of highly integrated devices.

A $p^+$ type or $n^+$ type silicon wafer doped with boron or phosphor to a high concentration has been used as a wafer for growing an epitaxial layer thereon. A N type or P type epitaxial wafer is produced by forming a $p^-$ type or $n^-$ type epitaxial layer doped with boron or phosphor to a low concentration on the $p^+$ type or $n^+$ type silicon wafer.

Characteristics of the epitaxial wafer when checked for quality control include the resistivity of the epitaxial layer, flatness of the epitaxial layer, and warpage of the epitaxial wafer, and haze of a surface of the epitaxial wafer. Especially, correct measurement of the resistivity is required since the resistivity is the most fundamental property of the wafer. Conventionally, the Hg-CV measurement belonging to capacitance-voltage measurement has been widely used as a method to measure the resistivity of an epitaxial layer of the above-described N type or P type epitaxial wafer. In the Hg-CV measurement, an oxide film is firstly formed on the surface of the epitaxial layer, and the oxide film is made to contact with a mercury electrode, thereby forming a so-called Schottky junction. Next, with the Schottky junction intervening, property of the capacitance (C) and electric voltage (V) in the reverse direction are measured. The resistivity of the wafer can be determined based on the measurement result of the C-V property and donor concentration. Japanese Unexamined Patent Application, First Publication No. H6-140478 (Patent reference 1) describes an apparatus for measuring the resistivity of an epitaxial layer based on a principle of the HV-CV measurement.

As a method for forming an oxide film on the surface of an n-type epitaxial layer, there is known a method standardized by ASTM F1392. In this method, a wafer is immersed for several minutes in a solution containing an oxidizing agent such as hydrogen peroxide, subsequently cleaned and dried. By this treatment, a thin oxide film is formed on the surface of the wafer.

However, in this method, a large amount of the solution containing the oxidizing agent are required, and a relatively long treating-time of about 20 to 30 minutes. In addition, there is a possibility that a long treating-time results in a delay of feed-back of measurement results of resistivity in the manufacturing process of epitaxial layers.

On the other hand, in the standard pretreatment-method of a p-type epitaxial layer, a wafer is immersed in a HF solution, subsequently rinsed in pure water, dried by spinning, and is subjected to Hg-CV measurement. Although this method allows measurement of resistivity of the p-type epitaxial layer, there is a demand for further reducing dispersion of the measured value. In an alternative method recently proposed for oxidizing n-type wafers (patent reference 2: Published Japanese Translation No.2002-516486 of PCT International Publication), ultraviolet (UV) light is irradiated to the wafer placed in an oxygen bearing atmosphere, thereby generating atomic oxygen or ozone and oxidizing the wafer by the atomic oxygen or by the ozone.

On the other hand, in a method proposed for treating a p-type wafer, an inert carrier gas is blown into the acid trap containing hydrofluoric acid, and a surface oxide film of the wafer is removed by the carrier gas.

However, even in the method described in Patent Reference 2, depending on the pretreatment conditions such as irradiation time of UV light, a dispersion in measured resistivity could not be avoided.

Based on the above-described circumstances, with regard to an n-type epitaxial layer, an object of the present invention is to provide a method for pre-treating the epitaxial layer, method for evaluating the epitaxial layer, and an apparatus for evaluating the epitaxial layer, which enable a reduction of consumption of the agent for pretreatment, shortening of treatment time, and reduction of dispersion of the measured value.

In addition, with regard to a p-type epitaxial layer, an object of the present invention is to provide a method for pre-treating the epitaxial layer, method for evaluating the epitaxial layer, and an apparatus for evaluating the epitaxial layer, which require a longer time than the conventional method, but enable a reduction of dispersion of the measured value.

SUMMARY OF THE INVENTION

In order to achieve the above-described objects, the present invention adopted the following constitution.

A method for pre-treating an epitaxial layer of the invention is a method for treating an epitaxial layer formed on a semiconductor wafer before evaluation of the epitaxial layer by making the epitaxial layer contact with a metal electrode to evaluate the epitaxial layer by a capacitance-voltage measurement, the method including; applying carbon-bearing compound (compound that contains carbon) to a surface of the epitaxial layer; irradiating ultraviolet (UV) light to the surface of the epitaxial layer; and forming an oxide film on the surface of the epitaxial layer.

As the carbon-bearing compound in the above-described method for pre-treating an epitaxial layer, any organic compound may be adopted provided that the compound has an affinity with the epitaxial layer. Preferably, the carbon-bearing compound used in the above-described method may be a surface-active agent. More preferably, the carbon-bearing compound may be a nonionic surface-active agent.

In the above-described method for pre-treating an epitaxial layer, it is preferable to set a thickness of the oxide film to be 5 Å (0.5 nm) or more and 30 Å (3 nm) or less.

Preferably, in the above-described method for pre-treating an epitaxial layer, the epitaxial layer may be an n-type or p-type epitaxial silicon layer, and the oxide film may be silicon oxide film.

In the above-described method for pre-treating an epitaxial layer, after applying the carbon-bearing compound to the surface of the epitaxial layer, UV light is irradiated to the epitaxial layer in an oxygen-bearing atmosphere. As a result, molecular oxygen is decomposed by the UV light and atomic oxygen is generated. By contact of the atomic oxygen with the epitaxial layer, an oxide film containing carbon is formed on the surface of the epitaxial layer. The carbon contained in the oxide film is derived from the carbon-bearing compound applied to the epitaxial layer before irradiation of the UV light. By having a metal electrode be in contact with or deposited on the surface of the oxide film for subjecting the epitaxial layer to evaluation, it is possible to obtain a non-dispersive evaluation result stably.

Specifically, in the case of the Hg-CV measurement utilizing a mercury electrode as the metal-electrode where a Schottky junction is made between the epitaxial layer and the electrode, by an effect of the oxide film on the Schottky junction, it is possible to reduce the dispersion of the evaluation results.

In addition, in the above-described method for pre-treating an epitaxial wafer, by utilizing a surface-active agent as the carbon-bearing compound, because of its superior affinity to the epitaxial layer, the carbon-bearing compound is thoroughly applied to the entire surface of the epitaxial layer, thereby homogenizing the carbon content in the oxide film and further reducing the dispersion of the evaluated value.

Since the above-described method is a simple pretreatment method including applying the carbon-bearing compound to the surface of the epitaxial layer and irradiating the UV light to the epitaxial layer in the oxygen bearing atmosphere, it is possible to remarkably shorten the pretreatment time of the n-type epitaxial layer. In addition, with regard to the pretreatment of the p-type epitaxial layer, the above-described method requires a slightly longer pretreatment time than the prior art, but enables highly reliable measurement because of a reduction of dispersion of the measured value. In order to make the oxide film contain carbon, only a small amount of carbon-bearing compound sufficient to wet the surface of the epitaxial layer is required to be applied to the surface of the epitaxial layer. Therefore it is possible to reduce the amount of the agent used in the pretreatment of the epitaxial layer.

An epitaxial wafer for evaluation according to the present invention may comprise a semiconductor wafer and an epitaxial layer formed on the semiconductor wafer, which has been pretreated by any of the above-described methods for pre-treating an epitaxial layer.

In such an epitaxial wafer, since the oxide film on the epitaxial layer contains carbon, in the evaluation of the epitaxial layer by making the epitaxial layer contact with a metal electrode or by vapor-depositing the metal-electrode to the surface of the epitaxial layer, it is possible to reduce the dispersion of the evaluated value. In the case of a metal-CV measurement utilizing the metal-electrode, a Schottky junction is formed between the metal-electrode and the epitaxial layer. That is, in the case of the Hg-CV measurement adopting a mercury electrode as the metal electrode, the Schottky junction is formed between the mercury electrode and the epitaxial layer. Since the oxide film has an influence on the Schottky junction, it is possible to reduce dispersion of the evaluation results.

A method for evaluating the epitaxial layer according to the invention comprises: applying a carbon-bearing compound to a surface of an epitaxial layer on a semiconductor wafer; irradiating UV light to the surface of the epitaxial layer, thereby forming an oxide film on the surface of the epitaxial layer; making the oxide film come in contact with a metal-electrode; and making a semiconductor wafer come in contact with a measuring electrode, and thereby evaluating the epitaxial layer by a capacitance-voltage measurement.

In the above-described method for evaluating an epitaxial layer, it is preferable that the carbon-bearing compound be a surface-active agent. Preferably, the surface active-agent may be a nonionic surface-active agent.

In the above-described method for evaluating the epitaxial layer, it is preferable to set a thickness of the oxide film to be in a range of 5 Å or more, and 30 Å or less.

In the above-described method for evaluating an epitaxial layer, it is preferable that the epitaxial layer be an n-type or a p-type epitaxial silicon layer, and the oxide film be a silicon oxide film.

In the above-described evaluation method, the oxide film is formed on the surface of the epitaxial layer, and the epitaxial layer is made to contact with a metal electrode or vapor-deposited with the metal-electrode and is subjected to evaluation by a capacitance-voltage measurement. In such an evaluation method, dispersion of evaluation values is reduced and therefore the epitaxial layer can be evaluated with high accuracy. In the case of the metal-CV measurement utilizing the metal electrode, a Schottky junction is formed between the metal-electrode and the epitaxial layer. That is, in the case of the Hg-CV measurement adopting a mercury electrode as the metal electrode, the Schottky junction is formed between the mercury electrode and the epitaxial layer. Since the oxide film has an influence on the Schottky junction, it is possible to reduce dispersion of the evaluation results.

An apparatus for evaluating an epitaxial layer according to the invention comprises: a pretreatment unit for pre-treating an epitaxial wafer having a semiconductor wafer and an epitaxial layer formed on the semiconductor wafer; a metal-electrode which can be made contact with or vapor-deposited on the surface of the epitaxial layer of the epitaxial wafer which has been pre-treated in the pre-treatment unit; a measuring electrode which can be made contact with or vapor-deposited on the semiconductor wafer; and a measuring unit which is connected to each of the electrodes and is used to measure physical properties of the epitaxial layer, wherein the pretreatment unit comprises an applying device for applying a carbon-bearing compound to a surface of the epitaxial layer, and an irradiation device for irradiating UV light to surface of the epitaxial layer in an oxygen bearing atmosphere.

In the above-described apparatus for evaluating the epitaxial layer, it is preferable that the carbon-bearing compound be a surface-active agent. Preferably, the surface-active agent may be a nonionic surface-active agent.

In the above-described apparatus for evaluating the epitaxial layer, it is preferable that the metal-electrode have a work function so as to form a Schottky junction with an n-type or a p-type epitaxial silicon layer. In addition, it is preferable that the above-described metal electrode be a mercury electrode.

Since the above-described apparatus for evaluating an epitaxial wafer comprises a pretreatment unit for pre-treating an epitaxial layer of the epitaxial wafer, it is possible to pre-treat the wafer and evaluate the wafer continuously, thereby enhancing efficiency of the evaluation. In addition, since the oxide film of the epitaxial layer may be made to contain carbon by the pretreatment in the pretreatment unit, by performing measurement of such an epitaxial layer, it is possible to reduce dispersion of the measured value.

As explained in the above-description, according to the present invention, with regard to the n-type epitaxial layer, it is possible to provide a method for pre-treating the n-type epitaxial layer, a method for evaluating the n-type epitaxial layer and an apparatus for evaluating the n-type epitaxial layer which require a short pretreatment time, small consumption of agent, and provide an evaluation value having a small dispersion.

With regard to the p-type epitaxial layer, it is possible to provide a method for pre-treating the p-type epitaxial layer, a method for evaluating the p-type epitaxial layer and an apparatus for evaluating the p-type epitaxial layer which require a slightly longer pretreatment time than the conventional method, but enable highly accurate measurement with a small dispersion of measured value.

DETAILED DESCRIPTION OF THE INVENTION

In the following, embodiments of the present invention are explained with reference to the drawings.

Figure 1:
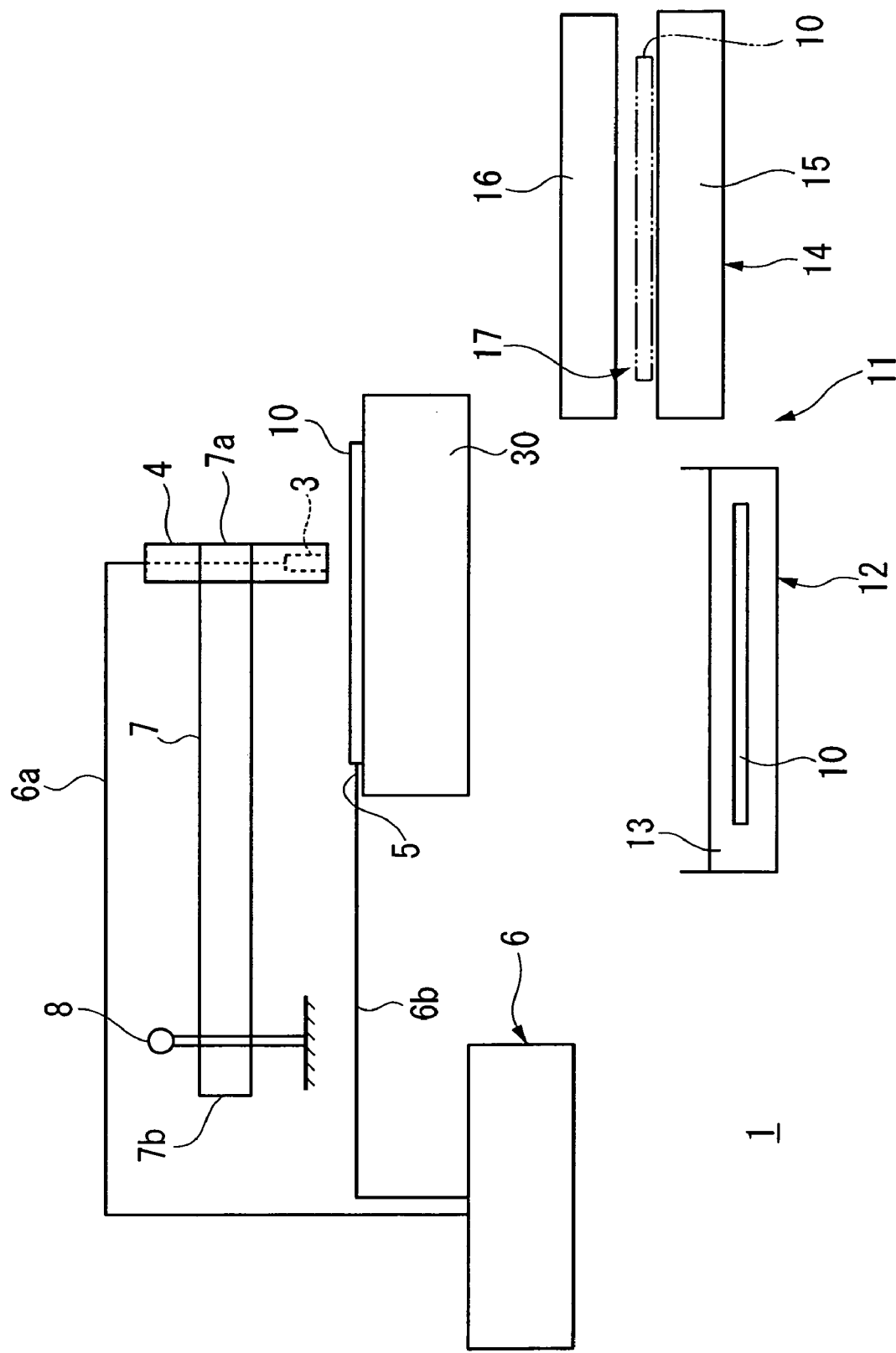
FIG. 1 is a schematic diagram showing a constitution of an apparatus for measuring resistivity as an embodiment of the present invention.

FIG. 1 is a schematic drawing that shows an apparatus for measuring resistivity (an apparatus for evaluating an epitaxial layer) used in an embodiment of the present invention in which an electrode is made to contact with the epitaxial layer.

Figure 2:
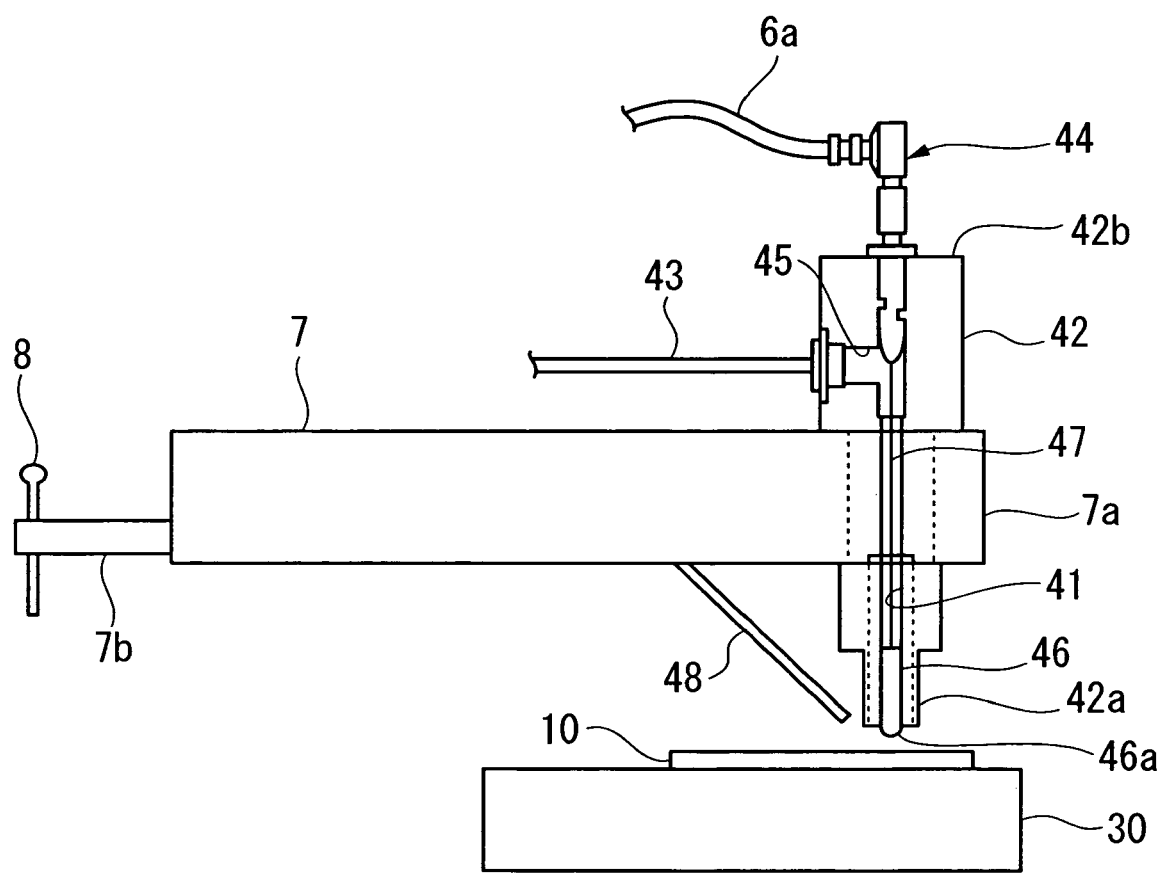
FIG. 2 is a schematic drawing of a measurement probe of the apparatus for measuring resistivity shown in FIG. 1.

FIG. 2 is a schematic drawing of an electrode probe of the apparatus for measuring the resistivity (hereafter referred to as a resistivity measuring apparatus) of FIG. 1. It should be noted that these drawings are intended to explain a configuration of the resistivity measuring apparatus. The size, thickness, and dimensions of individual part illustrated in the drawings may be different from the dimensional relationship of the parts of the actual apparatus.

As shown in FIG. 1, the resistivity measuring apparatus 1 of the present embodiment is schematically constituted to comprise a pretreatment unit 11 for pre-treating an epitaxial wafer 10 (wafer); a measurement probe 4 provided with a metal-electrode 3; a measuring electrode 5 which is made contact with the epitaxial wafer 10; and a measuring unit 6 which is connected to the respective electrodes 3 and 5 so as to measure a resistivity of the epitaxial wafer 10.

In addition, the resistivity measuring apparatus 1 further comprises an XY stage (a stage allowing lateral and longitudinal movement) 30 for mounting the epitaxial wafer 10; and a carrier device (not shown) for conveying the epitaxial wafer 10 which has been pre-treated from the pretreatment unit 11 to the XY stage 30. The resistivity measuring apparatus is constituted such that the metal-electrode 3 of the measuring probe 4 is made to contact with an upper surface of the epitaxial wafer 10 mounted on the XY stage 30. In the present embodiment, it is possible to use an R-θ stage (a stage allowing rotational movement) as an alternative to the XY stage 30.

The resistivity measuring apparatus 1 further comprises a support arm 7. The measurement probe 4 is placed on a leading end 7a of the support arm 7, and an arm driving device 8 is provided at another end 7b of the support arm 7. The arm driving device 8 is constituted so as to allow bilateral motion and vertical motion of the support arm 7. By this movement of the support arm 7, the measurement probe 4 can be moved to an arbitrary measuring position on the epitaxial wafer 10.

The metal electrode 3 is connected to the measuring unit 6 by a wiring 6a, and the measuring electrode 5 is connected to the measuring unit 6 by a wiring 6b so as to form a measuring circuit constituted of the wafer 10, the electrodes 3, 5 and the measuring unit 6. The measuring unit 6 is not limited to a specific constitution provided that properties of capacitance (C) and voltage (V) can be measured by the measuring unit 6. That is, the measuring unit 6 may have any constitution provided that it can be used in the measurement by a capacitance-voltage measurement.

In the resistivity measuring apparatus 1 of the present embodiment, the wafer 10 pre-treated in the pretreatment unit 11 is conveyed by the carrier device (not shown) to the XY stage 30. Subsequently, the metal electrode 3 and the measuring electrode 5 are connected to the wafer 10. After that, a resistivity of the epitaxial layer of the epitaxial wafer 10 can be measured by the metal electrode 3, measuring electrode 5 and the measuring unit 6.

The epitaxial wafer 10 as a target of measurement by the apparatus 1 is constituted to have an epitaxial silicon layer (epitaxial layer: not shown) on a semiconductor wafer (not shown). The semiconductor wafer may be selected from any of an n-type silicon wafer and p-type silicon wafer. In addition, the epitaxial silicon layer may be selected from any of an n-type epitaxial silicon layer and p-type epitaxial silicon layer.

The pretreatment unit 11 is provided with a reservoir 12 as an applying device so as to apply a carbon-bearing compounds to the surface of the epitaxial layer. The carbon-bearing compound 13 is reserved in the reservoir 12 such that the epitaxial wafer can be immersed in the carbon-bearing compound 13. In addition, a chucking device (not shown) is provided in a vicinity of the reservoir so as to chuck the epitaxial wafer 10, immerse the epitaxial wafer 10 in the reservoir 12 and pull up the epitaxial wafer 10 after the immersion.

The carbon-bearing compound 13 reserved in the reservoir 12 may be selected from any organic compound provided that the compound has an affinity to the epitaxial layer. Preferably, a surface-active agent is used as the carbon bearing compound 13. The surface-active agent may be selected from generally known cationic surface-active agents, anionic surface-active agents, and amphoterick surface-active agents, and nonionic surface-active agent. Nonionic surface-active agent is especially preferred.

For example, the non-ionic surface-active agent as the carbon-bearing compound may be selected from polyoxyethylene-alkylphenylether (APE), polyoxyethylene-alkylether (AE), fatty acid alkanolamide.

For example, as the polyoxyethylene-alkylphenylether, polyoxyethylene-octylphenylether, polyoxyethylene-nonylphenylether, or the like may be used.

As the polyoxyethylene-alkylphenylether, those having constituent alkyl radical having 12 to 22 carbons may be used, where the alkyl radical may be saturated or unsaturated, and may have normal-chain, branched-chain, or cyclic structure.

As the fatty acid alkanolamide, fatty acid monoethanolamide, fatty acid diethanolamide, fatty acid monoisopropanolamide, fatty acid diisopropanolamide or the like may be used. The fatty acid may be saturated or unsaturated as long as it is a higher fatty acid. For example, the fatty acid may be selected from capric acid, lauric acid, mylistic acid, stearic acid, and oleic acid or the like.

Especially, polyoxyethylene-alkylphenylether is preferable. More preferably, polyoxyethylene-octyl phenylether may be used. Polyoxyethylene-p-(1, 1,3, 3, -tetramethylbutyl) phenylether is more preferred.

In the present invention, as the above-described carbon-bearing compound, a single species of compound or two or more compounds may be used at the same time.

As the above-described carbon bearing compound, it is possible to use commercially available compound. Alternatively, it is possible it may be produced using a well-known method. For example, polyoxyethylene-alkylphenylether may be produced by extraction after a proper treatment subsequent to addition polymerization of ethylene oxide to alkylphenol under a presence of alkaline catalyst. Polyoxyethylene-alkylether may be produced by extraction after a proper treatment subsequent to addition polymerization of ethylene oxide to the alcohol under a presence of alkaline catalyst. Fatty acid alkanolamide may be produced by extraction after a proper treatment subsequent to condensation of alkanolamine and fatty acid.

Preferably, the carbon-bearing compound 13 is dispersively dissolved in a solution reserved in the reservoir 12. The reservoir 12 may be equipped with a heat insulation device for thermally insulating the carbon-bearing compound 13. Especially, when a carbon-bearing compound 13 of high melting point is used, by heating and melting the carbon-bearing compound 13 by the heat insulation device, the wafer 10 may be immersed in the carbon-bearing compound without using a solution for dispersing the carbon-bearing compound 13.

The pretreatment unit 11 further comprises a UV irradiating device 14 so as to irradiate ultraviolet (UV) light to the epitaxial wafer 10 in an oxygen bearing atmosphere after the immersion of the wafer 10 in the carbon-bearing compound 13. Transport of the wafer 10 between the reservoir 12 and the UV irradiation device 14 may be performed by the above-described chucking device or the like. Alternatively, an additional carrier device may be provided. The UV irradiating device 14 comprises a stage 15 for mounting the wafer 10; an ultraviolet light source 16 placed above the stage 15; an irradiation chamber 17 disposed between the stage 15 and the ultraviolet light source 16; and a gas supply device (not shown) to supply an oxygen bearing gas (for example an air) into the irradiation chamber 17, and which is constituted such that ultraviolet light can be irradiated from the ultraviolet light source 16 to the wafer 10 carried in the irradiation chamber 17.

It is preferable that UV light source 16 may irradiate UV light of a wavelength of about 185 nm to 254 nm. By irradiating UV light of about 185 nm, it is possible to convert the molecular oxygen in the oxygen bearing atmosphere such as air to atomic oxygen or ozone. In addition, by the irradiation of UV light of about 254 nm, it is possible to further decompose the once generated ozone to atomic oxygen. The atomic oxygen thus generated is made to contact with the surface of the epitaxial layer and oxidize the epitaxial layer, thereby providing a satisfactory oxide film which can be used for formation of a stable Schottky junction.

If the carbon-bearing compound 13 is dispersively dissolved in a solution in the reservoir 12, by immersing the wafer 10 in the reservoir 12, not only the carbon-bearing compound 13 but also the solution is applied to the wafer 10. In such a case, there is a possibility that the solution applying on the surface of the wafer 10 causes an adverse effect on the formation of an oxide film by UV irradiation. Therefore, a heating device for drying the wafer 10 may be provided between the reservoir 12 and UV irradiating device 14 so as to remove the solution by heating of the wafer 10 pulled up from the reservoir 12 before conveying the wafer 10 to the UV irradiation device.

As shown in FIG. 1 and FIG. 2, a schematic constitution of the measurement probe 4 includes: a probe main body 42 having a capillary 41 provided in its inside; a compressed gas supply pipe 43 connected to the probe main body 42; and an electrode terminal 44 connected to the probe main body. The capillary 41 is provided so as to penetrate the probe main body 42 along its longitudinal direction between an apex portion 42a and bottom end portion 42b of the probe main body 42.

To the side of apex portion 42a, a mercury column (mercury electrode) 46 is filled in the capillary. In the side of the apex portion 42a, the capillary is blocked by the mercury column 46. In addition, the side of the bottom end portion 42b of the probe main body 42 is equipped with the electrode terminal 44. In the side of the bottom end portion 42b, the capillary 41 is blocked by the electrode terminal 44. In addition, a branch path 45 is provided to the vicinity of the bottom end portion 42b of the probe main body 42. The compressed gas supply pipe 43 is connected to the end of the branch path 45. A pressure control device (not shown) is connected to the end of the compressed gas supply pipe 43.

The measurement probe 4 is constituted such that an internal pressure of the capillary 41 can be controlled by activating the pressure control device (not shown) which is connected to the capillary via the compressed gas supply pipe 43. Since the capillary 41 is blocked by the electrode terminal 44 in the bottom end portion 42b, and by the mercury column 46 in the apex portion 42a, by a fluctuation of internal pressure of the capillary 41, the mercury column in the apex portion 42a side of the capillary is moved along the longitudinal direction of the capillary so as to correspond to the internal pressure. It is preferable to control the internal pressure of the capillary 41 such that a tip 46a of the mercury column 46 is protruding with respect to the apex portion 42a of the probe main body 42. The tip 46a of the mercury column 46 is given a shape of a droplet by the surface tension of mercury, and only the tip 46a in the droplet shape is made to contact with the epitaxial layer of the epitaxial wafer 10.

The electrode terminal 44 is joined with a metal wire 47 which is inserted in the inside of the capillary 41, and a tip of the metal wire 47 is made to contact with the mercury column 46. The mercury column 46 and the metal wire 47 constitute the metal-electrode 3. The electrode terminal 44 is connected with the wiring 6a, and the metal wire 47 and the mercury column 46 are connected to the measuring unit 6.

The support arm 7 is provided with a gas supply pipe 48 such that an inert gas such as nitrogen gas can be supplied to the vicinity of the tip 46a of the mercury column 46 by the gas supply pipe 48.

Next, a method for pre-treating the epitaxial layer and a method for evaluating the epitaxial layer in accordance with the present embodiment are explained in the following.

Firstly, the epitaxial wafer 10 which is to be subjected to the evaluation is immersed in the reservoir 12 using the chucking device (not shown). The reservoir 12 reserves the above-described carbon-bearing compound 13. By immersing the wafer 10 in the reservoir, the carbon-bearing compound 13 is applied on the surface of the wafer 10. At that time, a time of the immersion of not less than 1 second is sufficient. Next, the wafer 10 is pulled up by the chucking device and carried to the UV irradiation apparatus 14. In a case in which the carbon-bearing compound 13 is dispersed in a solution in the reservoir 12, it is preferable to remove the solution from the wafer 10 pulled up from the reservoir 12 by heating the wafer using the above-described heating device. In addition, the amount of carbon-bearing compound 13 applying on the epitaxial layer is sufficient provided that the epitaxial layer is made wet by the carbon-bearing compound 13. From this point of view, the above-described immersion method is preferable as a pretreatment process of the epitaxial layer.

Next, an oxide film is formed in the UV irradiation device 14 by irradiating UV light to the epitaxial layer applied with the carbon-bearing compound 13. Firstly, on the stage 15 of the UV irradiation device 14, the wafer 10 is placed such that the epitaxial layer is on the upper side. Next, by activating the gas supply device (not shown), an oxygen bearing atmosphere is introduced in the chamber 17.

Next, the UV light source is switched on and UV light of about 185 nm to 254 nm in wavelength is irradiated to the epitaxial layer.

Figure 3:
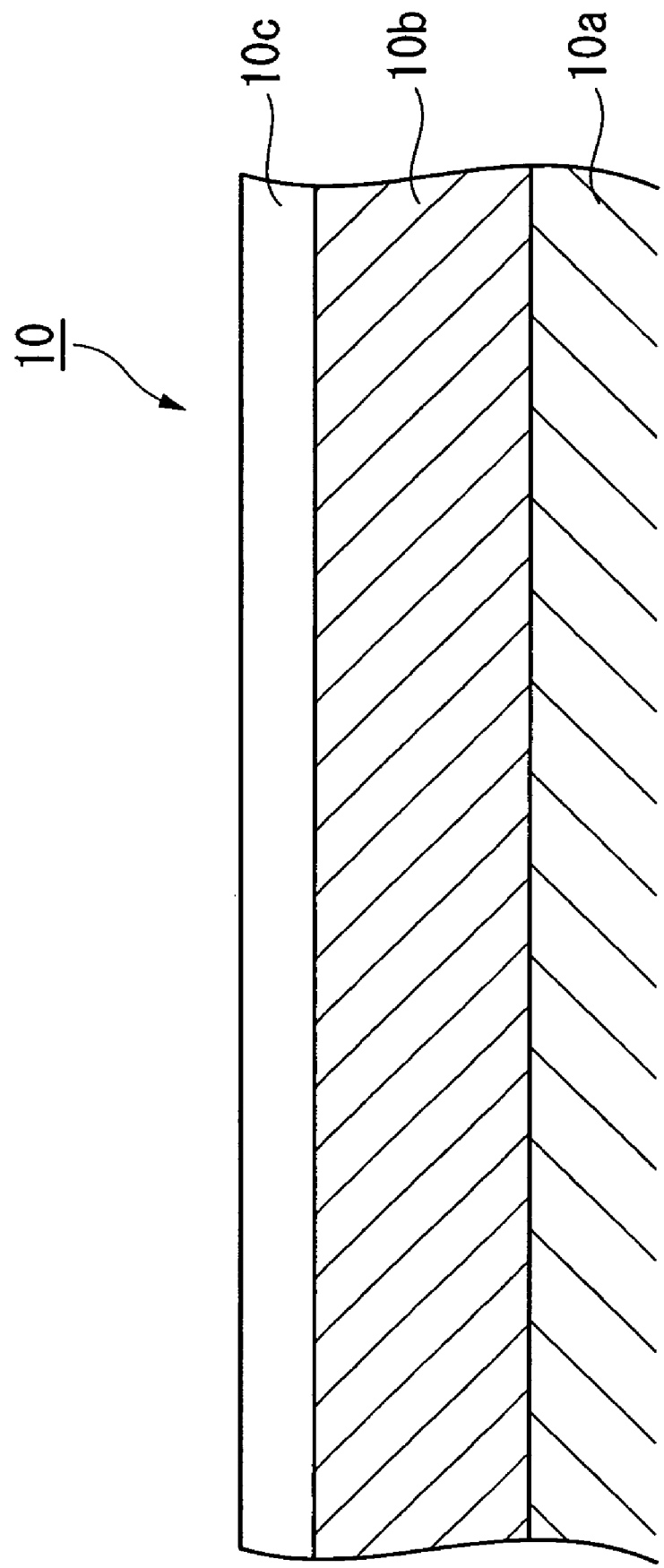
FIG. 3 is a schematic cross-section of an epitaxial layer after pretreatment.

By the UV irradiation, oxygen molecules in the oxygen bearing atmosphere are converted to atomic oxygen or ozone. The ozone is further decomposed to atomic oxygen by irradiation of UV light of about 254 nm in wavelength. The atomic oxygen thus generated contacts with the surface of the epitaxial layer and thereby oxidizes surface of the epitaxial layer. As a result, a satisfactory oxide film sufficient to allow the formation of a stable Schottky junction is formed. FIG. 3 illustrates a schematic cross sectional view of the epitaxial wafer 10 after the generation of the oxide film. As shown in FIG. 3, on an epitaxial layer 10b layered on a silicon wafer 10a, an oxide film 10c is formed by UV irradiation.

The time of UV light irradiation is preferably about 15 to 75 seconds, more preferably about 30 to 45 seconds.

The oxide film 10c formed by the above-described method contains carbon which originates from the carbon-bearing compound 13. The carbon in the oxide film is considered to have a form of one or both of atomic carbon or hydrocarbon, that is, carbon bonded with hydrogen. It is considered that those forms of carbon are generated by decomposition of a part of the carbon-bearing compound 13 by the UV irradiation. The carbon contained in the oxygen film 10c inhibits a charging of the surface of the oxide film 10c with negative electricity. Therefore, by making the metal electrode 3 come in contact with the surface of the oxide film 10c, a stable Schottky junction is formed reducing dispersion of the resistivity.

In that case, the thickness of the oxide film 10c is preferably in the range of 5 Å (0.5 nm) or more and 30 Å (3 nm) or less. If the thickness of the oxide film 10c is 5 Å or more, it is possible to perform the measurement of resistivity stably. If the thickness of the oxide film 10c is 30 Å or less, it is possible to remove the oxide film 10c from the wafer 10 easily after the measurement of resistivity, and the wafer 10 may be subjected to an evaluation for a second time. A carbon content in the oxide film is preferably, by weight %, 10% and more. If the carbon content is 10% or more, it is possible to perform the measurement of resistivity stably. For example, the carbon content in the oxide film may be determined from an intensity ratio of bond energy detected by X-ray photoelectron spectroscopy (XPS method). The method for measuring the carbon content is not limited to XPS, and it is possible to use other highly sensitive analyzing methods such as scanning ion mass spectroscopy (SIMS), Auger electron spectroscopy or the like.

After the above-described pretreatment, the epitaxial wafer 10 for evaluation is conveyed by the carrier device (not shown) to the XY stage 30. At that time, the wafer 10 is mounted on the surface of the XY stage 30 such that the pre-treated epitaxial layer faces the measurement probe 4.

In the following, the measuring electrode 5 is made to contact with the silicon wafer 10 and the mercury electrode 3 is made to contact with the surface of the epitaxial layer. By this setting, a Schottky junction is formed between the mercury electrode and the oxide film. In that state, electric stimulus is applied from the measuring unit 6 to the wafer 10, and a reaction of the wafer 10 to the electric stimulus is detected by the measuring unit 6, and the results of detection are converted to a C-V property (capacitance-voltage property). From this C-V property, it is possible to evaluate the concentration of dopant doped in the epitaxial layer and resistivity of the epitaxial layer or the like.

As explained above, according to the pre-treatment method and evaluation method of an epitaxial layer according to the present embodiment, by applying a carbon-bearing compound to the epitaxial layer and subsequently irradiating UV light to the epitaxial layer in an oxygen bearing atmosphere, atomic oxygen is generated by the decomposition of oxygen molecules by the UV light and is made contact with the epitaxial layer, it is possible to form an oxide film containing carbon. Since the oxide film thus formed inhibits a negative charging of the surface of the epitaxial layer, it is possible to perform measurement of resistivity stably.

In addition, by using a surface-active agent as the carbon-bearing compound, it is possible to further reduce the dispersion of evaluated values.

In the above-described pretreatment method, a time of 1 second or more is sufficient for immersion of the epitaxial layer in the carbon-bearing compound, and a time of about 30 to 45 seconds is sufficient for the UV light irradiation. Accordingly, at a minimum time, a duration for the total pretreatment process can be reduced to about 1 minute, which is remarkably shorter than the duration for the conventional pretreatment method. In addition, a small amount of carbon-bearing compound is sufficient for making the oxide film contain carbon provided that the surface of the epitaxial layer is made wet with the carbon-bearing compound. Since the amount of the carbon-bearing compound applied to the epitaxial layer can be reduced to a small amount, it is possible to reduce the total amount of agent used for the pretreatment of the epitaxial layer.

According to the apparatus 1 for evaluation according to the present embodiment, pretreatment of an epitaxial layer and measurement of resistivity can be performed by a single apparatus, and the measurement of resistivity of an epitaxial layer may be performed quickly and accurately.

In the present invention, as an alternative to the metal-electrode made to contact with the epitaxial layer, a metal-electrode may be vapor-deposited on the epitaxial layer. In the case of a vapor deposition method, after the pretreatment according to the present invention, a metal-electrode having a desirable area is formed using a vapor deposition apparatus. After the formation of the electrode, C-V measurement is performed, for example, by a commercially available C-V measuring apparatus. According to the vapor deposition method, it is possible to determine the area of the electrode accurately, and the resistivity can be measured correctly.

EXAMPLES

Example 1

Comparison of Pretreatment Method of the Invention and a Conventional Method

As Experimental Example 1, the pre-treatment method of the present invention was compared with a conventional method.

The pretreatment method of the present invention was performed using the following procedure.

Firstly, as objects of evaluation, N-type silicon wafers (hereafter referred to as sample wafers 1 were prepared so as to have a n-type epitaxial silicon layer of designed resistivity of 7.2 Ω·cm on an n-type silicon wafer respectively). In addition, in accordance with a constitution schematically shown in FIG. 1, an apparatus for measuring a resistivity was prepared. A reservoir of the apparatus was filled with a diluted solution in which dissolved a carbon-bearing compound, polyoxyethylene-p-(1, 1, 3, 3,-tetramethylbutyl)-phenylether was dissolved. In the diluted solution, stock solution was diluted to 1000 times with water. The stock solution was a mixed solution containing 25 to 30 weight % of polyoxyethylene-p-(1, 1, 3, 3,-tetramethylbutyl) phenylether, 30 to 40 weight % of water, and 37 weight % of ethylene glycol.

Next, the above-described sample wafer 1 was immersed in the reservoir of the resistivity measuring device shown in FIG. 1 so as to apply the polyoxyethylene-p-(1, 1, 3, 3,-tetramethylbutyl) phenylether to the surface of the epitaxial layer. At that time, time for immersion was controlled to be 5 seconds. Next, using a chucking device, the sample wafer 1 was pulled up from the reservoir and was conveyed to the UV irradiation device.

Next, the sample wafer 1 was placed on the stage of the UV irradiation device such that the epitaxial layer was placed on the upper side. Next, by activating the gas supply device (not shown), the inside of the chamber was maintained under an air atmosphere. Next, the UV light source was switched on and UV light of 185 to 254 nm in wavelength was irradiated to the surface of the epitaxial layer. The irradiation time was controlled to be 45 seconds. Thus, an oxide film was formed on a surface of the epitaxial layer of sample wafer 1.

Next, as an example of a conventional method, pretreatment of the sample wafer 1 was performed. In that pretreatment, the carbon-bearing compound was not applied to the surface of the epitaxial layer before UV irradiation. The other conditions of the pretreatment were controlled in accordance with the above-described procedure. As a result, an oxide film was formed on the surface of the epitaxial layer of the sample wafer 1.

Next, sample wafers 1 respectively pretreated in accordance with the method of the present invention and conventional method were subjected to measurement of resistivity by a Hg-CV measurement.

Figure 4:
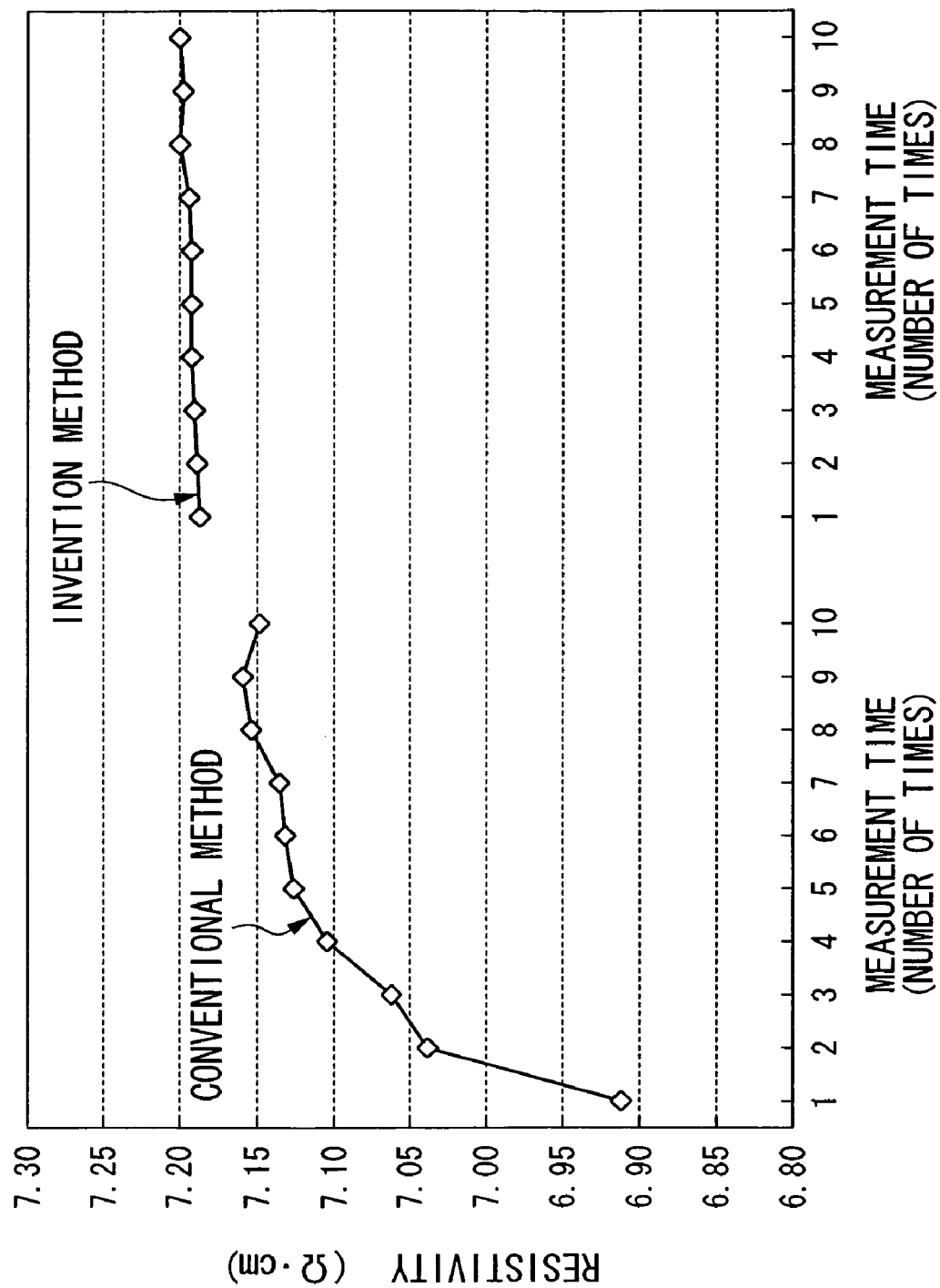
FIG. 4 is a graph showing results of measurement of resistivity of a sample wafer 1 measured by the method of the present invention and by the conventional method.

In each wafer, measurement of resistivity was repeated 10 times on the same portion. FIG. 4 shows the resistivity of the epitaxial layer measured each time. In addition, from the 10 measurements, average (x) and standard deviation (σ) were calculated, so as to determine the coefficient of variation given by σ/x×100(%). Table 1 shows the coefficient of variation for each wafers.

TABLE 1

| | COEFFICIENT OF VARIATION (%) | |
|---|---|---|
| | PRESENT INVENTION | CONVENTIONAL METHOD |
| SAMPLE WAFER 1 | 0.066 | 1.08 |

As shown in FIG. 4 and Table 1, according to the method of the present invention, the coefficient of variation and dispersion of resistivity are smaller than those of the conventional method. That is, accuracy of measurement of the method of the present invention is superior to that of the conventional method. Moreover, as shown in FIG. 4, each of the measured values according to the present invention are approximate to the designed resistivity of 7.20 Ω·cm. That is, the measured value itself has excellent accuracy in the method of the present invention.

Example 2

Evaluation of Reproducibility of the Pretreatment Method of the Present Invention As objects of evaluation, three types of epitaxial wafers (hereafter referred to as sample wafers 2, sample wafers 3, and sample wafers 4) were prepared. Sample wafers 2 had an n-type epitaxial layer of designed resistivity of 30.91 Ω·cm layered on a p-type silicon wafer; sample wafers 3 had an n-type epitaxial layer of designed resistivity of 7.205 Ω·cm layered on a n-type silicon wafer; and sample wafers 4 had an n-type epitaxial layer of designed resistivity of 0.354 Ω·cm layered on a n-type silicon wafer. Each of the wafers was pretreated with the above-described method of the present invention and above-described conventional method and an oxide film was formed on an epitaxial layer of each wafer. Next, sample wafers 2, 3, 4 which had been pretreated by the method of the present invention and by the conventional method were subjected to, the same as in Example 1, 10 repeated measurements of resistivities of the epitaxial layers, and coefficients of variation given by σ/x×100(%) were determined.

After the measurement of resistivity, epitaxial layers of sample wafers 2, 3, 4 were treated with hydrofluoric acid and the oxide film was removed from the epitaxial layer of each wafer. After the removal of the oxide film, wafers 2 to 4 were again subjected to pretreatment in accordance with the method of the invention and the conventional method in accordance with the procedures described in Example 1 so as to form oxide films on the epitaxial layers. Then, the sample wafers 2-4 pretreated with the method of the present invention or with the conventional method were subjected to measurement of the resistivity of the epitaxial layer and coefficient of variation given by σ/x×100(%).

Further, the above-described treatments were repeated for three times. As a result, each wafer was subjected to five pretreatments, and measurements of resistivity and determinations of coefficient of variation were carried out after each pretreatment. The results are shown in FIGS. 5, 6, 7 and Table 2.

TABLE 2

| | COEFFICIENT OF VARIATION (%) | | | | |
|---|---|---|---|---|---|
| | 1st pre-treatment | 2nd pre-treatment | 3rd pre-treatment | 4th pre-treatment | 5th pre-treatment |
| SAMPLE WAFER 2 | 0.0942 | 0.1691 | 0.0745 | 0.0453 | 0.0629 |
| SAMPLE WAFER 3 | 0.0783 | 0.0699 | 0.0578 | 0.1179 | 0.0400 |
| SAMPLE WAFER 4 | 0.0736 | 0.0471 | 0.1036 | 0.0841 | 0.0779 |

Figure 5:
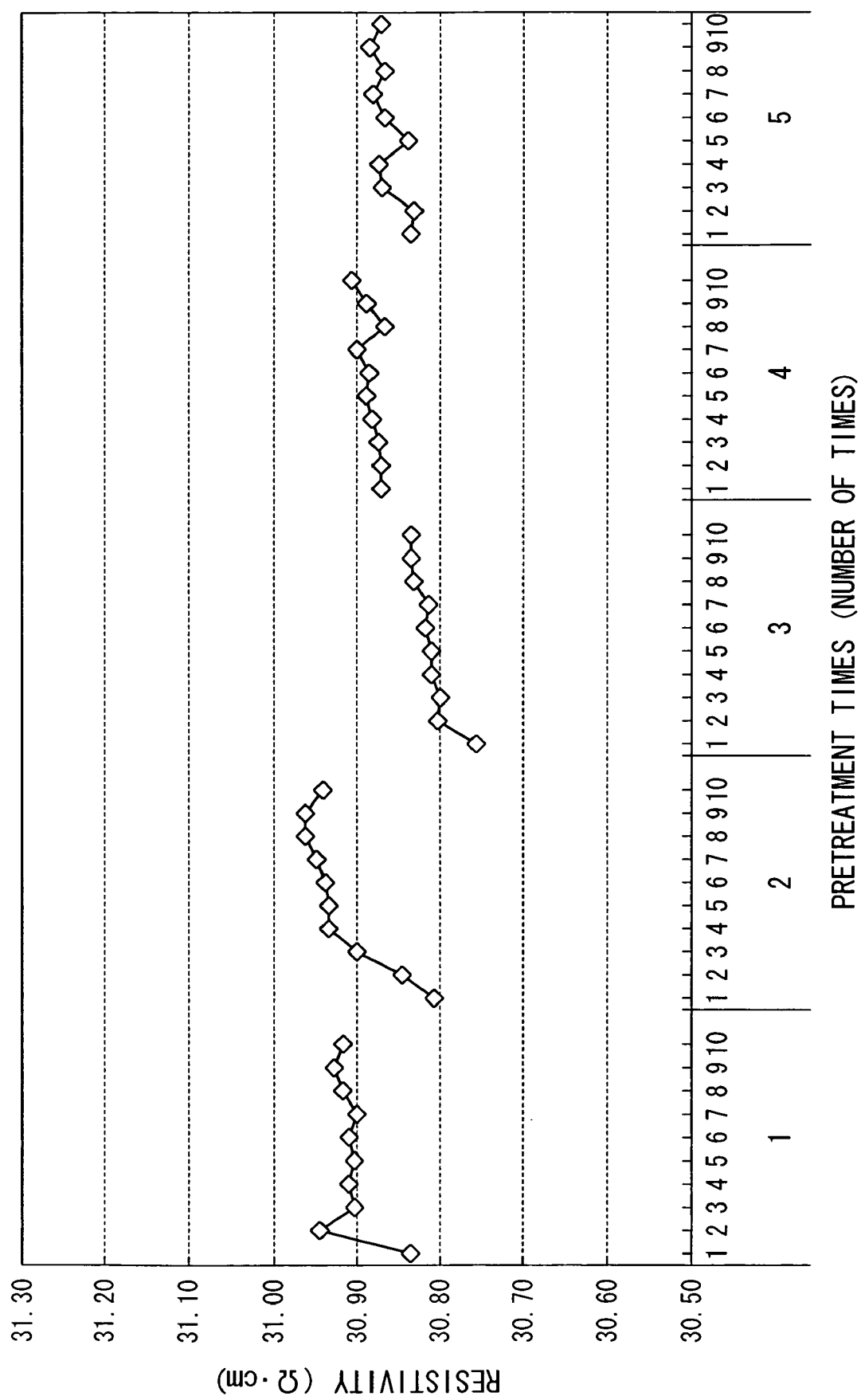
FIG. 5 is a graph showing results of measurement of resistivity of a sample wafer 2 of Example 2 measured by the method of the present invention.
Figure 6:
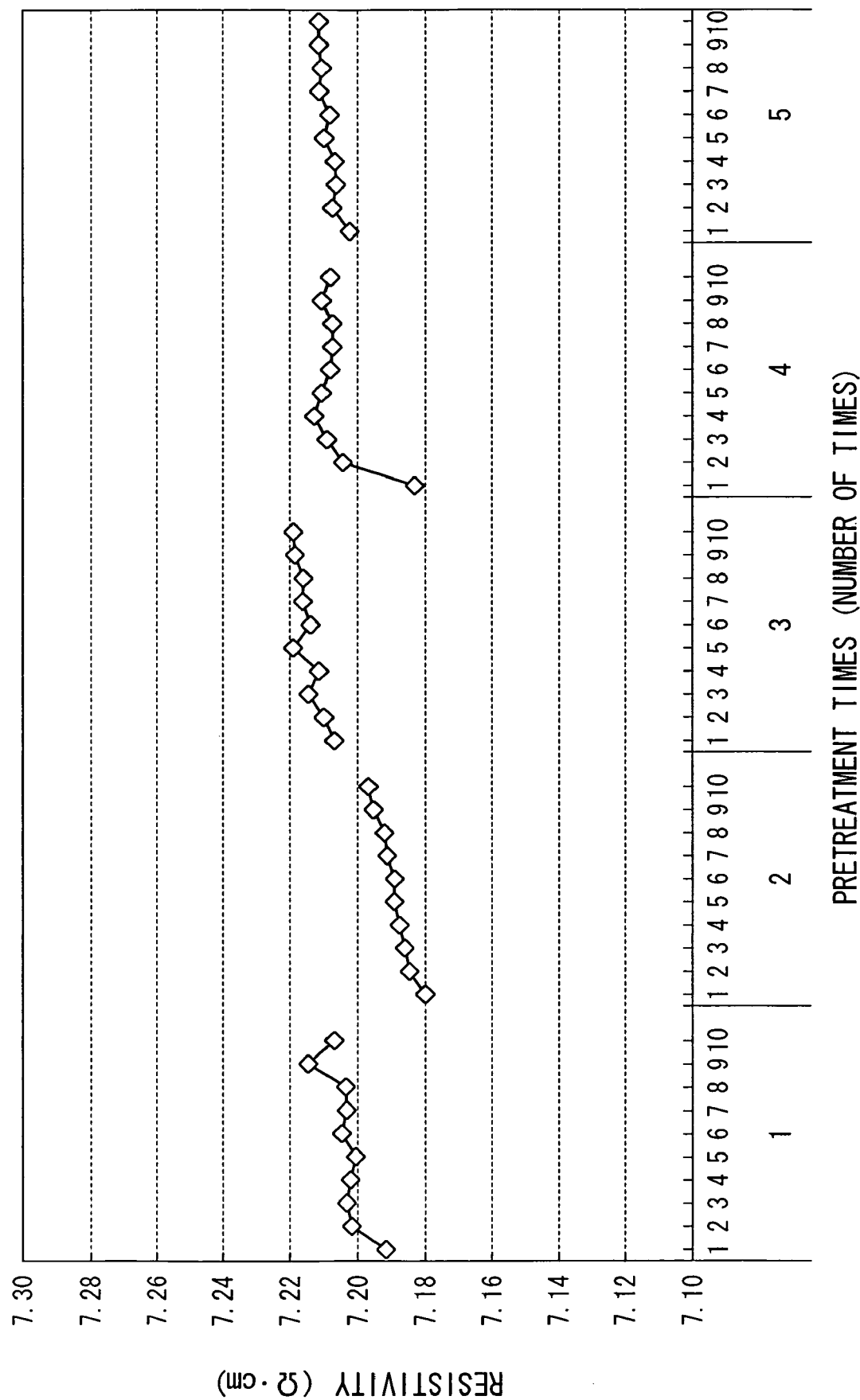
FIG. 6 is a graph showing results of measurement of resistivity of a sample wafer 3 of Example 2 measured by the method of the present invention.
Figure 7:
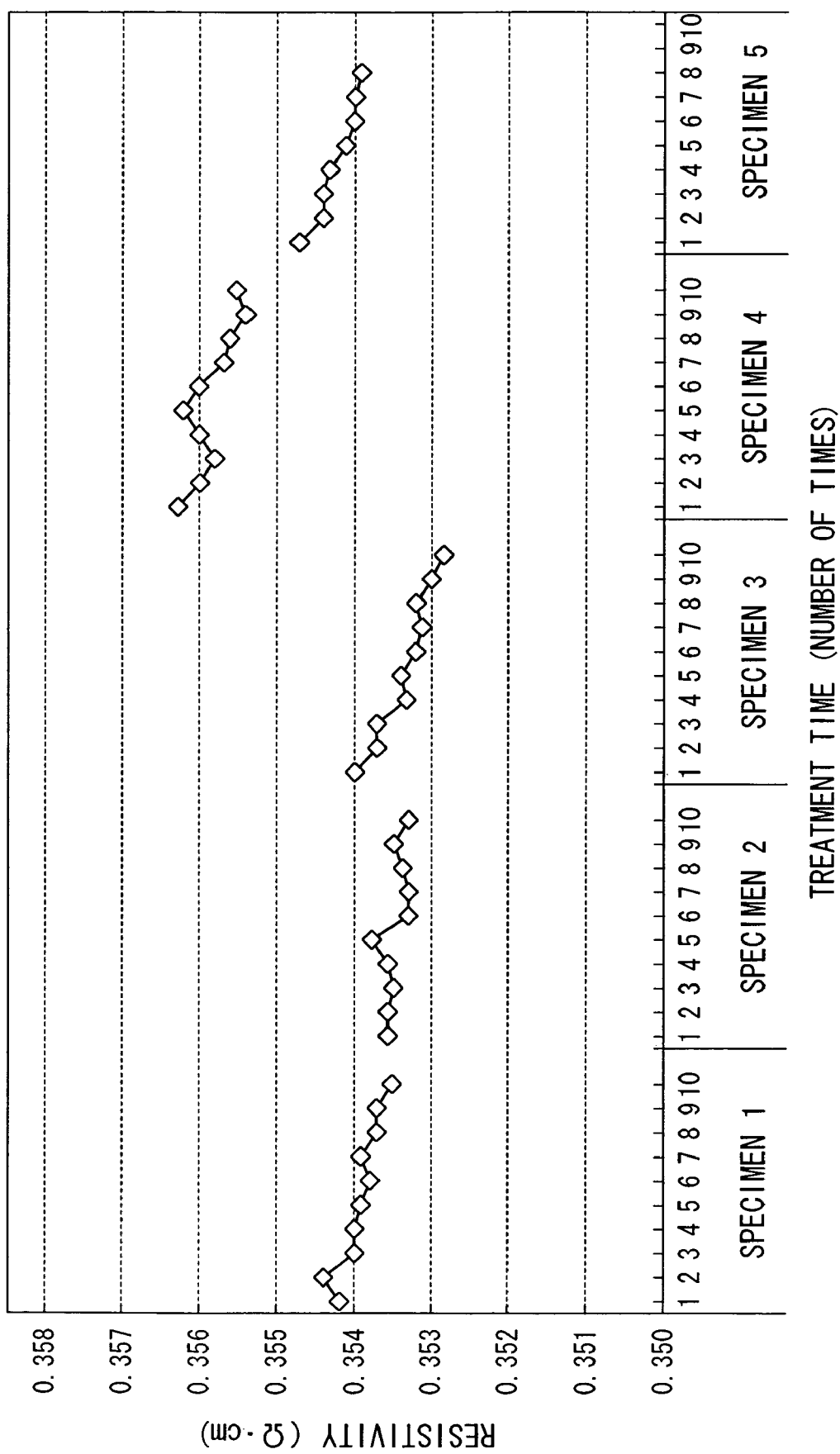
FIG. 7 is a graph showing results of measurement of resistivity of a sample wafer 4 of Example 2 measured by the method of the present invention.

As shown in FIGS. 5 to 7 and Table 2, according to the method of present invention, even though pretreatment is repeated a plurality of times, irrespective of the magnitude of resistivity, measured values of each sample wafers 2-4 exhibit a smaller coefficient of variation than that of Example 1. That is, the method of the present invention is superior in accuracy of measurement compared with the conventional method. In addition, as shown in FIGS. 5, 6, and 7, each of the measured values is approximate to the designed resistivity of the epitaxial layer, which is 30.91 Ω·cm in FIG. 5, 7.205 Ω·cm in FIG. 6, and 0.354 Ω·cm in FIG. 7. That is, each of the measured values itself shows a highly accurate value.

Moreover, as shown in FIG. 5 to FIG. 7, the measured resistivity shows a small dispersion among the repeated measurements. Therefore, it can be understood that the method of pretreatment of the present invention has excellent reproducibility.

Example 3

Evaluation of Stability of Pretreatment-Method in Accordance with the Present Invention As objects of evaluation, three types of epitaxial wafers (hereafter referred to as sample wafers 5, sample wafers 6, and sample wafers 7) were prepared. Sample wafer 5 had an n-type epitaxial layer of designed resistivity of 29.86 Ω·cm layered on a p-type silicon wafer; sample wafers 6 had an n-type epitaxial layer of designed resistivity of 7.20 Ω·cm layered on a n-type silicon wafer; and sample wafers 7 had an n-type epitaxial layer of designed resistivity of 0.2591 Ω·cm layered on an n-type silicon wafer. Each of the wafers was pretreated with the above-described method of the present invention and above-described conventional method and an oxide film was formed on an epitaxial layer of each wafer. Next, sample wafers 5, 6, 7 which have been pretreated by the method of the present invention and by the conventional method were subjected to, as same as Example 1, 10 times repeated measurements of resistivities of the epitaxial layers, and coefficients of variation given by σ/x×100(%) were determined.

Next, the sample wafers 5, 6, 7 were subjected to a protracted treatment such that the wafers were left for 24 hours (1 day) to stand under conditions of an air atmosphere, temperature of 23° C., relative humidity of 45%. After that, the resistivity of each of the epitaxial layers was measured again in accordance with the procedure of Example 1, and was subjected to determination of the coefficient of variation given by σ/x×100(%).

Further, the above-described protracted treatment was carried out three times. As a result, measurements of resistivity and determination of coefficient of variation were carried out five times within 5 days. The results are shown in FIGS. 8 to 10 and Table 3.

TABLE 3

| | COEFFICIENT OF VARIATION (%) | | | | |
|---|---|---|---|---|---|
| | 1st DAY | 2nd DAY | 3rd DAY | 4th DAY | 5th DAY |
| SAMPLE WAFER 5 | 0.0647 | 0.12487 | 0.11782 | 0.0931 | 0.0718 |
| SAMPLE WAFER 6 | 0.0497 | 0.1459 | 0.0682 | 0.0682 | 0.1122 |
| SAMPLE WAFER 7 | 0.1325 | 0.1062 | 0.0891 | 0.0747 | 0.0596 |

Figure 8:
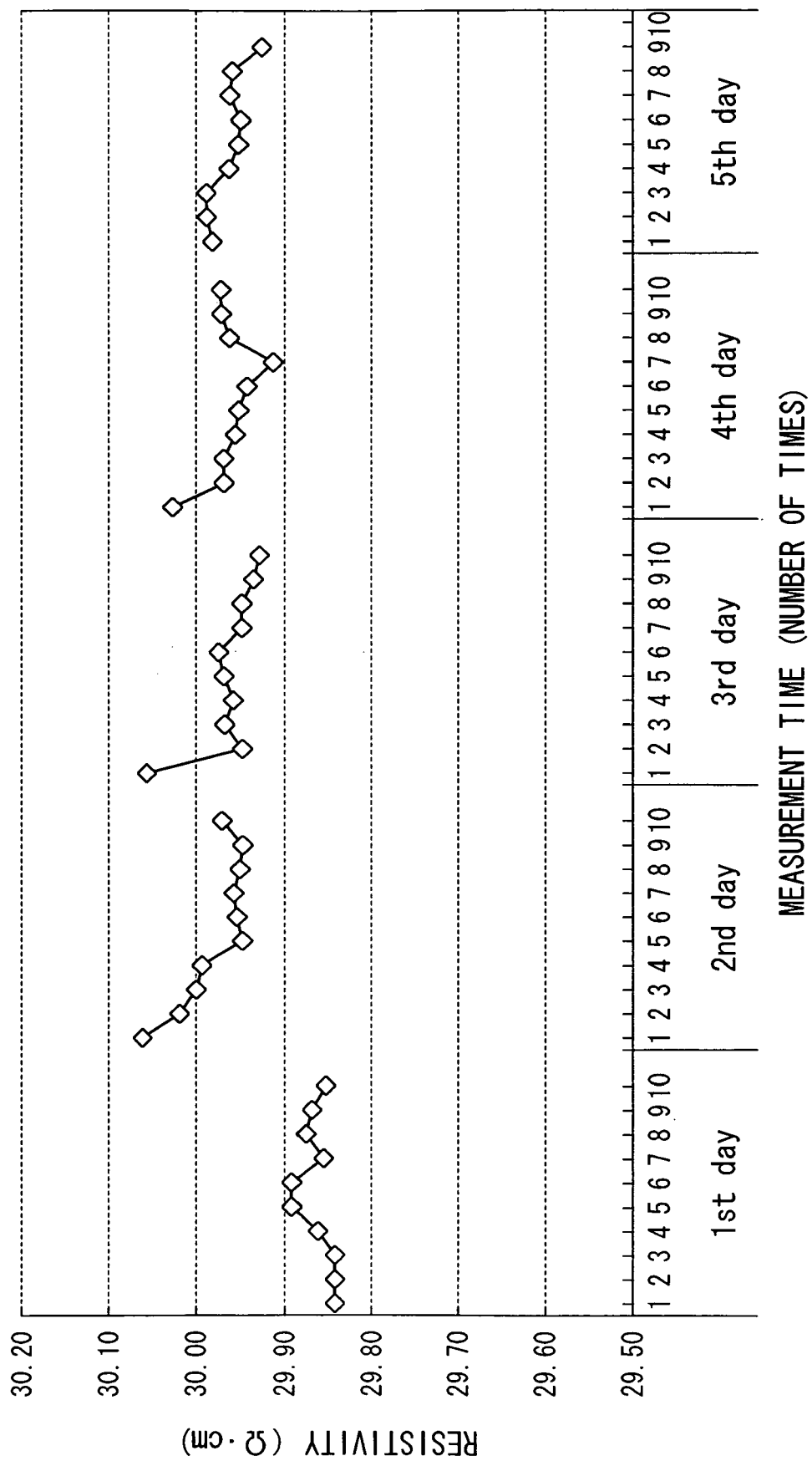
FIG. 8 is a graph showing a results of measurement of resistivity of a sample wafer 5 of Example 3 measured by the method of the present invention.
Figure 9:
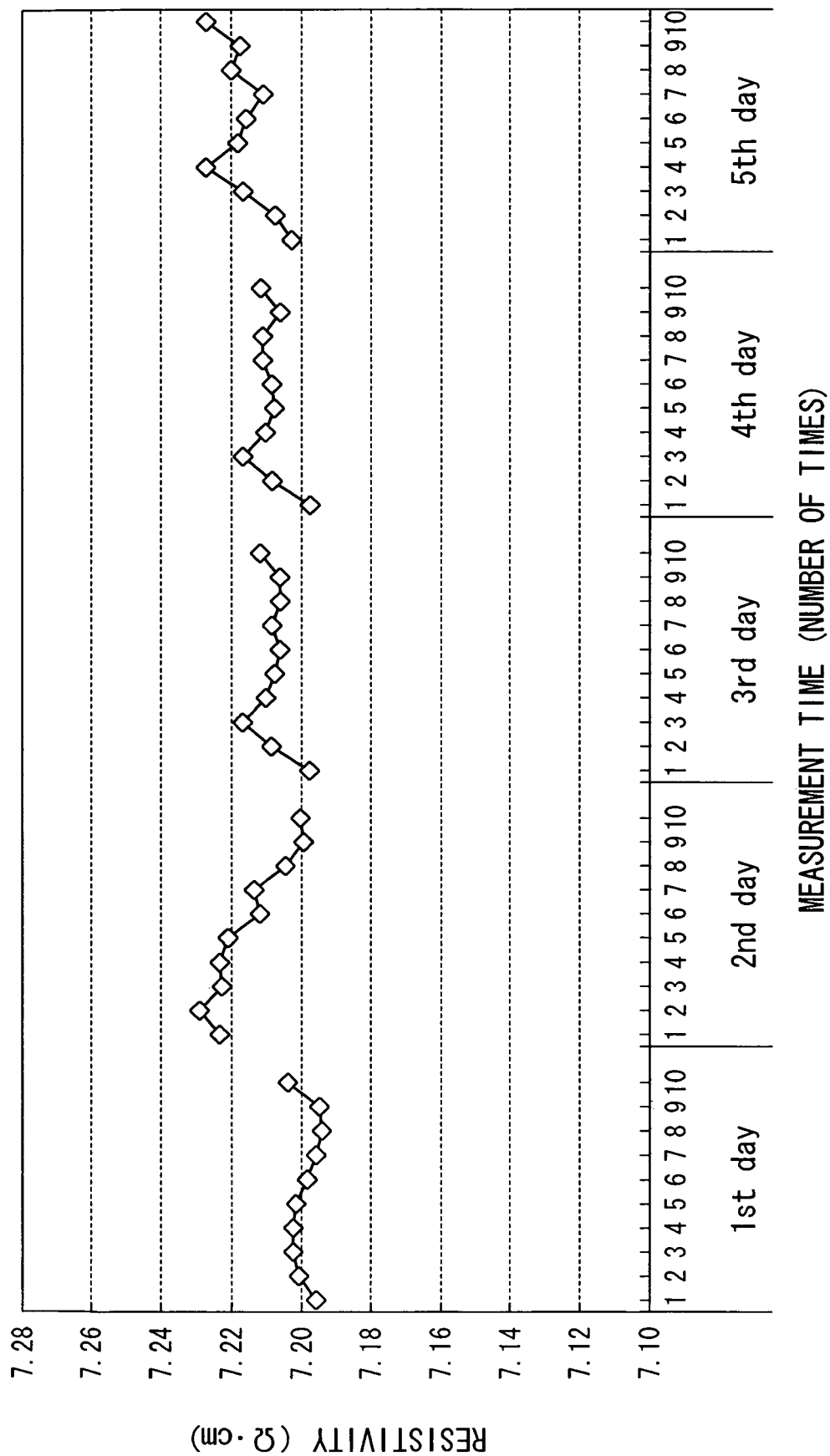
FIG. 9 is a graph showing a results of measurement of resistivity of a sample wafer 6 of Example 3 measured by the method of the present invention.
Figure 10:
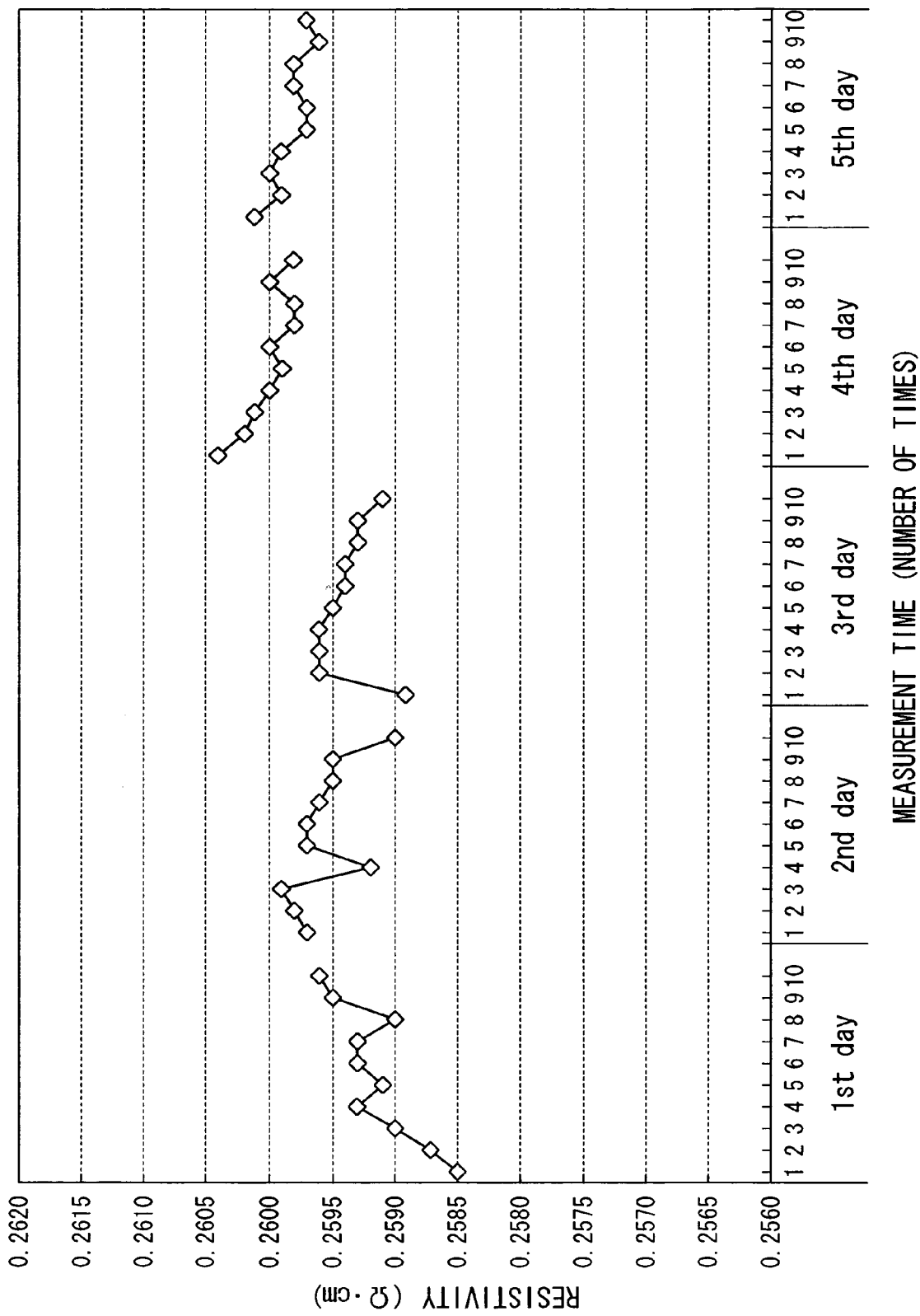
FIG. 10 is a graph showing a results of measurement of resistivity of a sample wafer 7 of Example 3 measured by the method of the present invention.

As shown in FIGS. 8 to 10 and Table 3, in accordance with the method of the present invention, even in the case of 5 days after the pretreatment, irrespective of the magnitude of resistivity, each of the sample wafers 5-7 exhibited a smaller coefficient of variation than that of conventional example in Example 1. That is, the method of the present invention is superior in accuracy of measurement compared with the conventional method. In addition, as shown in FIGS. 8, 9 and 10, each of the measured values is approximate to the designed resistivity of the epitaxial layer, which is 29.86 Ω·cm in FIG. 8, 7.20 Ω·cm in FIG. 9, and 0.2591 Ω·cm in FIG. 10. That is, each of the measured values itself shows highly accurate value. Moreover, as shown in FIGS. 8, 9 and 10, the measured resistivity shows a small dispersion among the repeated measurement. Therefore, it can be understood that the oxide films formed by the method of the present invention have excellent stability.

Example 4

Preferable Condition of the Pretreatment-Method of the Present Invention (1)

As an object of evaluation, epitaxial wafers (hereafter referred to as sample wafers 8) were prepared so as to have an n-type epitaxial silicon layer of designed resistivity of 7.20 Ω·cm on a p-type silicon wafer. The sample wafers 8 were subjected to pretreatment in which time for immersion of the wafer in the reservoir was selected from 0 second, 1 second, 5 seconds, 30 seconds, and 60 seconds. Other conditions of the pretreatment were the same as those of Example 1. As a result, an oxide film was formed on each of the epitaxial layers. Next, for each time of immersion, each of the sample wafers 8 after the pretreatment using the respective immersion time was subjected to measurement of resistivity of the epitaxial layer 10 repeated times in accordance with the procedure of Example 1 and the coefficient of variation given by σ/x×100(%) was determined. The results are shown in FIG. 11 and Table 4.

TABLE 4

| | COEFFICIENT OF VARIATION (%) | | | | |
| --- | --- | --- | --- | --- | --- |
| | immersion 0 second | immersion 1 second | immersion 5 seconds | immersion 30 seconds | immersion 60 seconds |
| SAMPLE WAFER 8 | 1.079 | 0.066 | 0.072 | 0.042 | 0.061 |

Figure 11:
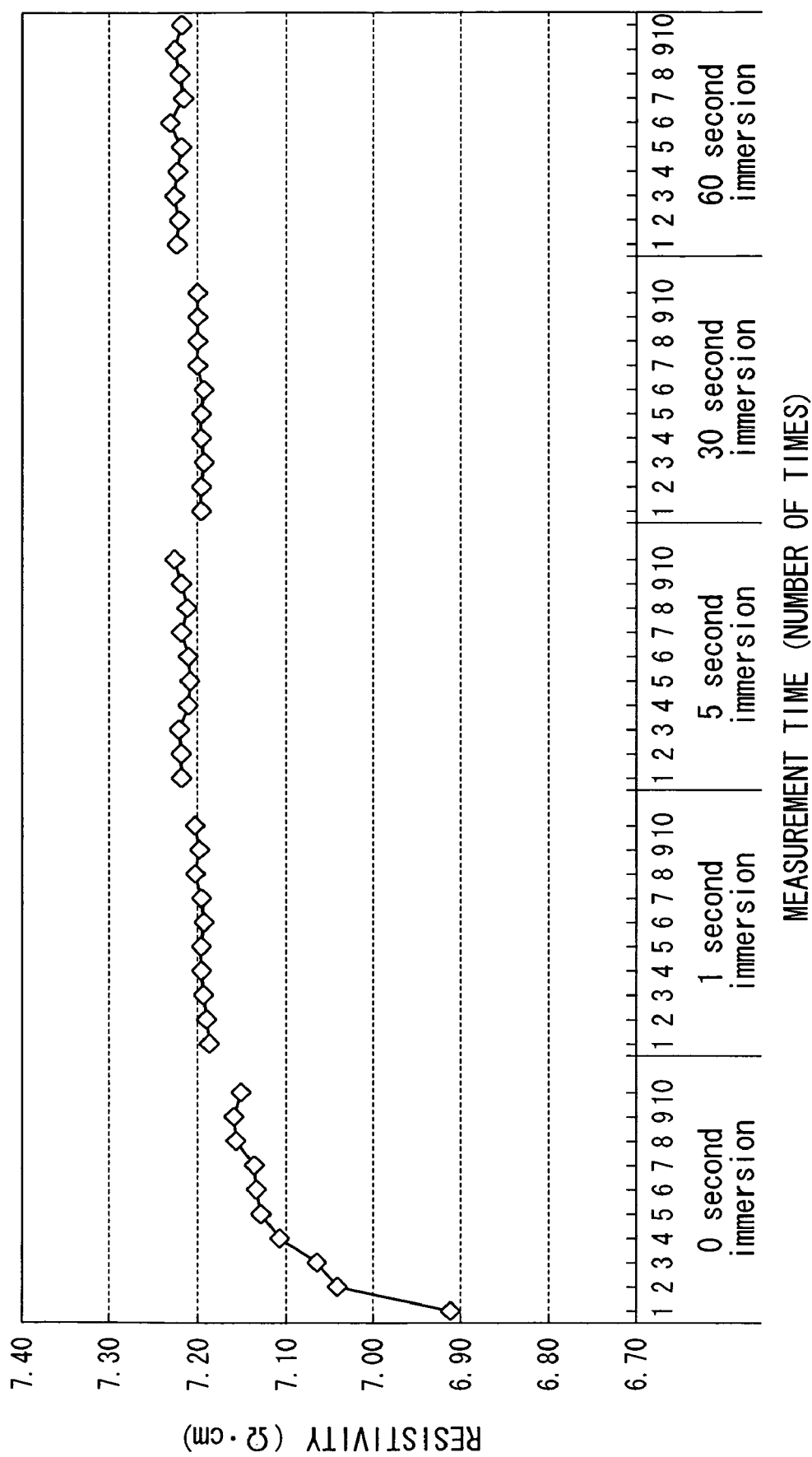
FIG. 11 is a graph showing results of measurement of resistivity of a sample wafer 8 of Example 4 measured by the method of the present invention.

As shown FIG. 11 and Table 4, in accordance with the present invention in which the immersion time was controlled to be in a range of 1 to 60 seconds, irrespective of length of the immersion time, the coefficients of variation show smaller values than those in the case of using an immersion time of 0 second (conventional method), thereby providing excellent accuracy for the measurement. In addition, as shown in FIG. 1, each of the measured values in accordance with the method of the present invention using an immersion time of 1 to 60 seconds is approximate to the designed resistivity of 7.20 Ω·cm. Therefore, it can be understood that the measured value itself has an excellent accuracy. In addition, as shown in FIG. 11, the dispersion of resistivity among different immersion times shows a small value indicating that there is only a small influence of the difference in immersion time on the measured value.

From the above-described results, 1 second or more is sufficient time for immersion of a wafer in the reservoir.

Example 5

Preferable Condition of the Pretreatment Method of the Invention (2)

Figure 12:
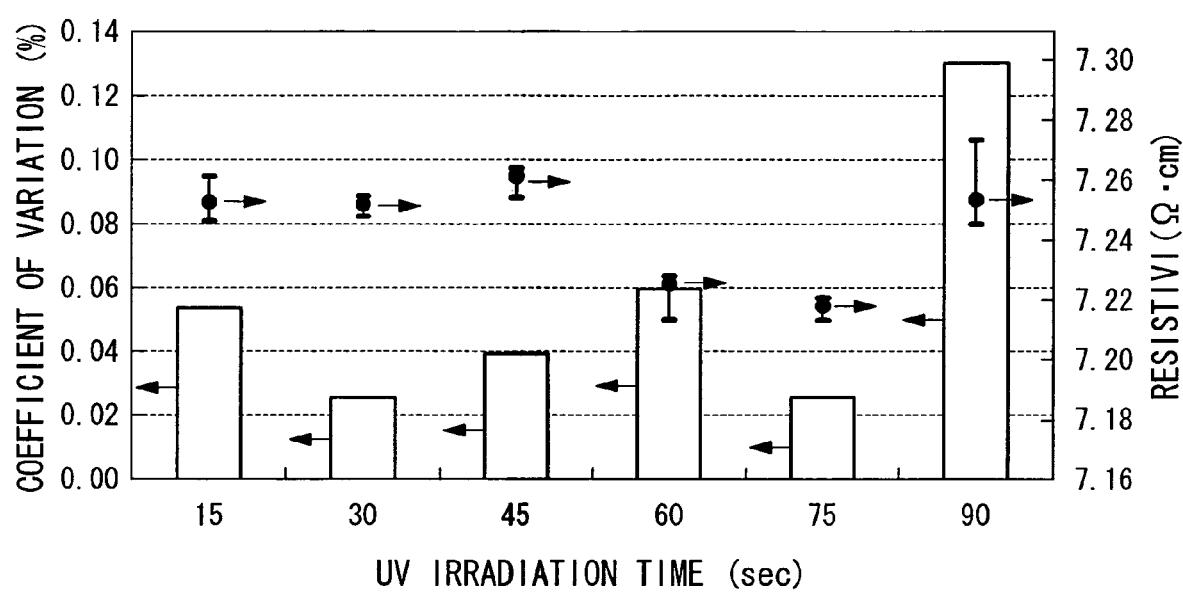
FIG. 12 is a graph showing results of measurement of resistivity and coefficient of variation of a sample wafer 8 of Example 5 measured by the method of the present invention.

As an object of evaluation, the above-described sample wafers 8 were prepared and subjected to pretreatment. In the pretreatment, irradiation time of the UV light was controlled in the range of 0 to 180 seconds. Other conditions for the pretreatment were in accordance with the procedure of Experiment 1. Next, for each irradiation time, a pretreated sample wafer 8 was subjected to measurement of resistivity of epitaxial layer 10 repeated times in accordance with the method of Example 1. The results are shown in FIG. 12.

After the pretreatment, the epitaxial layer of each wafer was subjected to X-ray photoelectron spectroscopic analysis (XPS analysis). The XPS analysis was carried out after removing the surface adsorbate from the epitaxial layer by argon ion etching. The results are shown in Table 5. In Table 5, the thickness of the carbon layer and the oxide layer were calculated from the results of XPS analysis. Since it is not clear if the carbon has a layered structure in the oxide film or the carbon is homogeneously distributed in the whole oxide film, the thickness of the oxide film and thickness of the carbon layer were determined based on the intensity ratio of the Si spectrum and C spectrum detected in the XPS analysis.

TABLE 5

| | IRRADIATION TIME (sec) | THICKNESS OF OXIDE FILM (nm) | THICKNESS OF CARBON LAYER (nm) |
| --- | --- | --- | --- |
| SAMPLE WAFER 8 | 0 | 1.9 | 2.1 |
| | 10 | 1.9 | 1.6 |
| | 30 | 1.8 | 1.4 |
| | 60 | 2.3 | 0.6 |
| | 180 | 2.0 | 0.9 |

As shown in FIG. 12, in the case of using an irradiation time of 17 to 75 seconds, the coefficient of variation shows a satisfactory value of not not more than 0.06%. On the other hand, in the case of using an irradiation time of 90 seconds, the coefficient of variation exceeds 0.12% and reduces the accuracy of measurement. From the results shown in FIG. 12, a preferable time for UV irradiation is 30 to 45 seconds.

As shown in FIG. 5, in the case of an irradiation time of 60 seconds or more, the thickness of the carbon layer shows a remarkable reduction. It is considered that the reduction of thickness of the carbon layer is related to the increase of the coefficient of variation.

As explained in the above description of Examples 1 to 5, in accordance with the present invention, it is possible to control the coefficient of variation of the resistivity to be 0.1% or less. In addition, the results show that the preretreatment method of the present invention is a stable pretreatment method having excellent reproducibility where pretreatment was repeated for a plurality of times. Moreover, the correlation between the resistivity and the pretreatment conditions such as UV irradiation time is restricted to a reduced range, showing a stability of the method of the present invention. In addition, the time required for the pretreatment is at least about 1 minute, and at most about several minutes, which is remarkably shorter than the treatment time of the conventional pretreatment method using hydrogen peroxide solution.

While preferred embodiments of the invention have been described and illustrated above, it should be understood that these are exemplary of the invention and are not to be considered as limiting. Additions, omissions, substitutions, and other modifications can be made without departing from the spirit or scope of the present invention.

For example, while, in the above-described embodiment, the pretreatment of the epitaxial layer was carried out in the pretreatment unit of the resistivity measuring apparatus shown in FIG. 1, the present invention is not limited to that embodiment, and the pretreatment may be performed in an apparatus for pretreatment constituted independently from the resistivity measuring apparatus. A procedure to apply a carbon-bearing compound to the epitaxial layer is not limited to the immersion method described in the embodiment. For example, the carbon-bearing compound may be painted or sprayed on the epitaxial layer. While, in the above-described embodiment, evaluation was carried out based on resistivity, any other physical properties may be applied to the evaluation provided that the property can be evaluated based on capacitance-voltage property utilizing the Schottky junction.

In the above-described embodiment, an applying unit was exemplified by a reservoir. However, the applying unit is not limited to the reservoir and other appropriate methods for applying, such as a spin coating device, may be employed.

Accordingly, the invention is not to be considered as being limited by the foregoing description, and is only limited by the scope of the appended claims.

What is claimed is:

1. A method for pre-treating an epitaxial layer formed on a semiconductor wafer before evaluation of the epitaxial layer by making the epitaxial layer contact with a metal electrode to evaluate the epitaxial layer by a capacitance-voltage measurement, the method comprising:
applying carbon-bearing compound to a surface of the epitaxial layer;
irradiating ultraviolet light to the surface of the epitaxial layer; and
forming an oxide film on the surface of the epitaxial layer
wherein the carbon-bearing compound is a surface-active agent and the oxide film contains carbon.

2. The method for pre-treating an epitaxial layer according to claim 1, wherein the surface active-agent is a nonionic surface active agent.

3. The method for pre-treating an epitaxial layer according to claim 2, wherein the nonionic surface active agent includes one, two, or more selected from polyoxyethylene-alkylphenylether, polyoxyethylene-alkylether, and fatty acid alkanolamide.

4. The method for pre-treating an epitaxial layer according to claim 1, wherein, the epitaxial layer is an n-type epitaxial silicon layer, and the oxide film is a silicon oxide film.

5. The method for pre-treating an epitaxial layer according to claim 1, wherein the epitaxial layer is a p-type epitaxial silicon layer, and the oxide film is a silicon oxide film.

6. A method for evaluating an epitaxial layer formed on a semiconductor wafer, comprising:
applying a carbon-bearing compound to a surface of an epitaxial layer on a semiconductor wafer;
irradiating ultra violet light to the surface of the epitaxial layer, thereby forming an oxide film on the surface of the epitaxial layer;
making the oxide film come in contact with a metal-electrode;
making the semiconductor wafer come in contact with a measuring electrode, and
evaluating the epitaxial layer by a capacitance-voltage measurement
wherein the carbon-bearing compound is a surface-active agent and the oxide film contains carbon.

7. The method for evaluating an epitaxial layer according to claim 6, wherein the surface active agent is a nonionic surface active agent.

8. The method for evaluating an epitaxial layer according to claim 6, wherein the epitaxial layer is an n-type epitaxial silicon layer, and the oxide film is a silicon oxide film.

9. The method for evaluating an epitaxial layer according to claim 6, wherein the epitaxial layer is a p-type epitaxial silicon layer, and the oxide film is a silicon oxide film.

10. The method for evaluating an epitaxial layer according to claim 6, wherein the nonionic surface active agent includes one two, or more selected from polyoxyethylene-alkylphenylether, polyoxyethylene-alkylether, and fattyacid alkanolamide.

* * * * *